US011335498B2

(12) United States Patent
Sánchez Lago et al.

(10) Patent No.: US 11,335,498 B2
(45) Date of Patent: May 17, 2022

(54) INSULATION OF NON-LIQUID IMMERSED TRANSFORMERS

(71) Applicant: HITACHI ENERGY SWITZERLAND AG, Baden (CH)

(72) Inventors: Luis Sánchez Lago, Vigo (ES); Carlos Roy Martín, Saragossa (ES); Rafael Murillo, Saragossa (ES); Lorena Cebrián Lles, Saragossa (ES); Antonio Nogués Barrieras, Saragossa (ES)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 16/970,215

(22) PCT Filed: Feb. 14, 2019

(86) PCT No.: PCT/EP2019/053740
§ 371 (c)(1),
(2) Date: Aug. 14, 2020

(87) PCT Pub. No.: WO2019/158665
PCT Pub. Date: Aug. 22, 2019

(65) Prior Publication Data
US 2021/0050145 A1   Feb. 18, 2021

(30) Foreign Application Priority Data
Feb. 15, 2018 (EP) .................... 18382087

(51) Int. Cl.
*H01F 27/29* (2006.01)
*H01F 27/28* (2006.01)
(Continued)

(52) U.S. Cl.
CPC ....... *H01F 27/323* (2013.01); *G01R 31/1263* (2013.01); *G01R 31/16* (2013.01);
(Continued)

(58) Field of Classification Search
CPC .... H01F 27/323; H01F 27/24; H01F 27/2828; H01F 27/29; G01R 31/16; G01R 31/1263
See application file for complete search history.

(56) References Cited

U.S. PATENT DOCUMENTS 4,663,603 A * 5/1987 van Riemsdijk ..... H01F 27/324
                                                         336/60
5,572,129 A   11/1996 Carlson
(Continued)

FOREIGN PATENT DOCUMENTS

CN   101151689 A   3/2008
CN   202159559 U   3/2012
(Continued)

OTHER PUBLICATIONS

International Preliminary Report on Patentability, PCT/EP2019/053740, dated Aug. 18, 2020, 7 pages.
(Continued)

*Primary Examiner* — Alvaro E Fortich
*Assistant Examiner* — Zannatul Ferdous
(74) *Attorney, Agent, or Firm* — Sage Patent Group (57) ABSTRACT

Non-liquid immersed transformers and methods of measuring aging degree of the transformers' insulation are disclosed. The transformers comprise a solid insulation inside the conductive coil and one or more floating electrodes in the solid insulation. At least a part of the conductive coil and the one or more floating electrodes may form one or more capacitive elements, respectively. An electrical parameter, e.g. complex permittivity, of the capacitive element is measured and the aging degree is calculated as a function of the electrical parameter measurement.

17 Claims, 8 Drawing Sheets

(51) Int. Cl.
  *H01F 27/32* (2006.01)
  *H01F 27/24* (2006.01)
  *G01R 31/12* (2020.01)
  *G01R 31/16* (2006.01)

(52) U.S. Cl.
  CPC ......... *H01F 27/24* (2013.01); *H01F 27/2828* (2013.01); *H01F 27/29* (2013.01)

(56) References Cited

U.S. PATENT DOCUMENTS

| | | | | |
|---|---|---|---|---|
| 6,459,995 | B1* | 10/2002 | Collister | G01N 27/221 702/23 |
| 7,038,470 | B1* | 5/2006 | Johnson | G01N 27/226 250/390.05 |
| 7,095,357 | B1* | 8/2006 | Johler | G01S 13/0218 342/175 |
| 10,110,177 | B1* | 10/2018 | Koroglu | H03F 3/45475 |
| 2008/0211611 | A1 | 9/2008 | Hanov | |
| 2009/0173896 | A1* | 7/2009 | Loeken | G03F 7/70916 250/504 R |
| 2009/0256429 | A1* | 10/2009 | Fan | H02K 53/00 310/25 |
| 2016/0189858 | A1* | 6/2016 | Bormann | H01F 27/343 336/150 |
| 2019/0041450 | A1* | 2/2019 | Yang | H02K 3/40 |

FOREIGN PATENT DOCUMENTS

| | | |
|---|---|---|
| CN | 202159559 U | 3/2012 |
| CN | 204374235 U | 6/2015 |
| CN | 204834330 U | 12/2015 |
| CN | 205318992 U | 6/2016 |
| CN | 205450098 U | 8/2016 |
| CN | 206057485 U | 3/2017 |
| CN | 206057485 U | 3/2017 |
| CN | 107202920 A | 9/2017 |
| CN | 108431623 A | 2/2018 |
| CN | 206961661 U | 2/2018 |
| CN | 206961661 U | 2/2018 |
| CN | 109030885 A | 12/2018 |
| EP | 0112482 A1 | 7/1984 |
| JP | S5067420 A | 6/1975 |
| JP | H0254906 A | 2/1990 |
| JP | 02215109 A * | 8/1990 |
| JP | H02215109 A | 8/1990 |
| KR | 20130098857 A | 9/2013 |
| KR | 20170055890 A | 5/2017 |
| WO | WO 2016/081844 A1 | 5/2013 |
| WO | WO 2013/061615 A1 | 5/2016 |

OTHER PUBLICATIONS

International Search Report and Written Opinion of the International Searching Authority, PCT/EP2019/053740, dated Mar. 18, 2019, 13 pages.
Extended European Search Report of the European Patent Office, EP18382087.7-1212, dated Jul. 26, 2018, 8 pages.
First Office Action, Japanese Patent Application No. 2020-542147, dated Dec. 8, 2020, 9 pages (JP-Language and EN-Language).
First Office Action, Korean Patent Application No. 10-2020-7022206, dated Aug. 13, 2020, 6 pages (KR-Language and EN-Language).
Search Report, Chinese Patent Application No. 2019800099874, dated Mar. 22, 2021, 4 pages.

* cited by examiner

INSULATION OF NON-LIQUID IMMERSED TRANSFORMERS

CROSS REFERENCE TO RELATED APPLICATIONS

This application is a 35 U.S.C. § 371 national stage application of PCT International Application No. PCT/EP2019/053740 filed on Feb. 14, 2019, which in turns claims foreign priority to European Patent Application No. 18382087.7, filed on Feb. 15, 2018, the disclosures and content of which are incorporated by reference herein in their entirety.

FIELD OF INVENTION

The present disclosure relates to transformers and more particularly to electrical insulation of non-liquid immersed, e.g. dry type transformers.

BACKGROUND

As is well known, a transformer converts electricity at one voltage level to electricity at another voltage level, either of higher or lower value. A transformer achieves this voltage conversion using a first coil and a second coil, each of which are wound around a ferromagnetic core and comprise a number of turns of an electrical conductor. The first coil is connected to a source of voltage and the second coil is connected to a load. The ratio of turns in the primary coil to the turns in the secondary coil ("turns ratio") is the same as the ratio of the voltage of the source to the voltage of the load.

Other types of transformers are also well known and are called multiwinding transformers. Such transformers use multiple windings connected in series or in parallel or independently depending on the desired functionality of the transformer.

Non-liquid immersed transformers incorporate coils in which the turns are isolated from each other with solid dielectric materials, e.g. polyesters.

The coil also might have solid insulation materials placed between group of turns (e.g. forming disks or layers) and/or to the exterior of the coil. For this purpose, the coil might be encapsulated in e.g. epoxy resin by a molding process or manufactured with additional solid insulating materials, e.g. fiberglass pre-impregnated with epoxy resins, in the aforementioned locations.

Over time, the dielectric properties of the solid insulation, e.g. epoxy resin and polyester, change due to aging of the material. Transformer aging is directly associated to insulation aging. The aging state of the transformer is mainly related to the condition of the solid insulation inside the coils.

US 2008/211611 discloses an entirely cast resin transformer which includes at least one lower voltage winding and at least one upper voltage winding.

U.S. Pat. No. 4,663,603 describes a winding system for gas-cooled transformers, comprising windings disposed around a core; and at least one insulation torus, consisting of an insulating mass, said torus having embedded therein electrodes electrically connected to an adjoining winding for suppression of the electric field intensity between windings and electrodes.

CN 202159559 relates to an axial tripartition dry type rectification transformer.

CN 206961661 discloses a dry-type auto transformer that adopts segmentation wire-wound pouring circle tube structure.

SUMMARY

A non-invasive method and system is disclosed to evaluate the aging degree of the solid insulation inside the coils of a dry transformer. The method relates to the measurement of electrical properties (e.g. the complex permittivity in the frequency spectrum) of the solid insulation through floating electrodes, i.e. electrodes that are not in contact with conductive elements of the coil, introduced in-between turns and/or group of turns (e.g. discs and layers) in at least the thermo-dielectrical critical regions (i.e. coil extremes) of the transformer.

In a first aspect, a non-liquid immersed transformer is disclosed. The non-liquid immersed transformer comprises a core; a coil having a conductive winding around the core; a solid insulation material in the coil; one or more floating electrodes in the solid insulation. At least a part of the conductive winding and the one or more floating electrodes form one or more capacitive elements, respectively, and the transformer comprises a capacitance metering device connected between a terminal connected to the one or more floating electrodes and a terminal connected to the part of the conductive winding. Thus maintenance and repair of non-liquid type transformers is facilitated as well as end-of-life predictions based on an estimated rate of aging.

By forming a capacitive element with the use of the floating electrode, it is possible to measure dielectric properties of the solid insulation over time.

In some examples, the non-liquid immersed transformer may comprise a plurality of floating electrodes distributed in the solid insulation, each floating electrode to form a capacitive element with a different part of the conductive winding. Thus, aging of different areas of the transformer may be measured independently.

In some examples, the coil may comprise a foil coil. The floating electrode may be placed between foils. The capacitive element may then be formed between the floating electrode and the foils of the coil.

In some examples, the coil may comprise a foil-disk coil. The floating electrode may be placed between foil turns of a disk of the disk coil. The capacitive element may be formed between the floating electrode and the foil turns of the winding.

In some examples, the conductive winding may comprise a CTC-disk coil, where CTC stands for continuously transposed conductors. The floating electrode may be placed between CTC turns of a disk of the disk coil. The capacitive element may be formed between the floating electrode and the CTC turns of the winding.

In some examples, the conductive winding may comprise a strap-disk coil. The floating electrode may be placed between turns of a disk of the strap-disk. The capacitive element may be formed between the floating electrode and the strap turns of the winding.

In some examples, the floating electrode may be a floating ring placed between disks of the disk coil. The capacitive element may be formed between the floating ring and the disks of the winding.

In some examples, the winding may comprise a layer coil. The floating electrode may be placed between turns of a layer of the layer coil. The turns may be of the strap or of the CTC type. The capacitive element may be formed between the floating electrode and the turns of the winding.

In some examples, the conductive winding may comprise a layer coil. The floating electrode may be placed between layers of the layer coil. The capacitive element may be formed between the floating electrode and the layers of the winding.

In some examples, the conductive winding may comprise a random-wire coil. The floating electrode may be placed between cables of the random-wire coil. The capacitive element may be formed between the floating electrode and the cables of the random-wire coil.

In some examples, the floating electrode may be placed along a portion of the solid insulation. For example, the floating electrode may be placed in thermos-dielectrical critical regions such as the winding extremes.

In some examples, the non-liquid immersed transformer may be a dry-type transformer.

In some examples, the solid insulation may be one of a polyester film, an epoxy resin or a meta-aramid material, such as Nomex®.

In another aspect, a method of assessing aging degree of at least a portion of a solid insulation of a non-liquid immersed transformer is disclosed. The non-liquid immersed may comprise capacitive elements according to examples disclosed herein. The method may comprise measuring an electrical parameter of the capacitive element and calculating the aging degree as a function of the electrical parameter measurement, wherein the electrical parameter measured is complex permittivity.

In some examples, the electrical parameter measured is permittivity. For example, the method may measure a variation of the complex permittivity of the solid insulation. Through the measurement of this value along a frequency sweep, preferably in the close-to-DC subrange, e.g. between 0 Hz and 5 Hz, of the solid insulation preferably located in the thermo-dielectrical critical regions of the coils (the most aged parts) and by comparison with the non-aged condition, the aging state of the transformer and the remaining life can be predicted.

BRIEF DESCRIPTION OF THE DRAWINGS

Non-limiting examples of the present disclosure will be described in the following, with reference to the appended drawings, in which.

DETAILED DESCRIPTION OF EXAMPLES

Figure 1A:
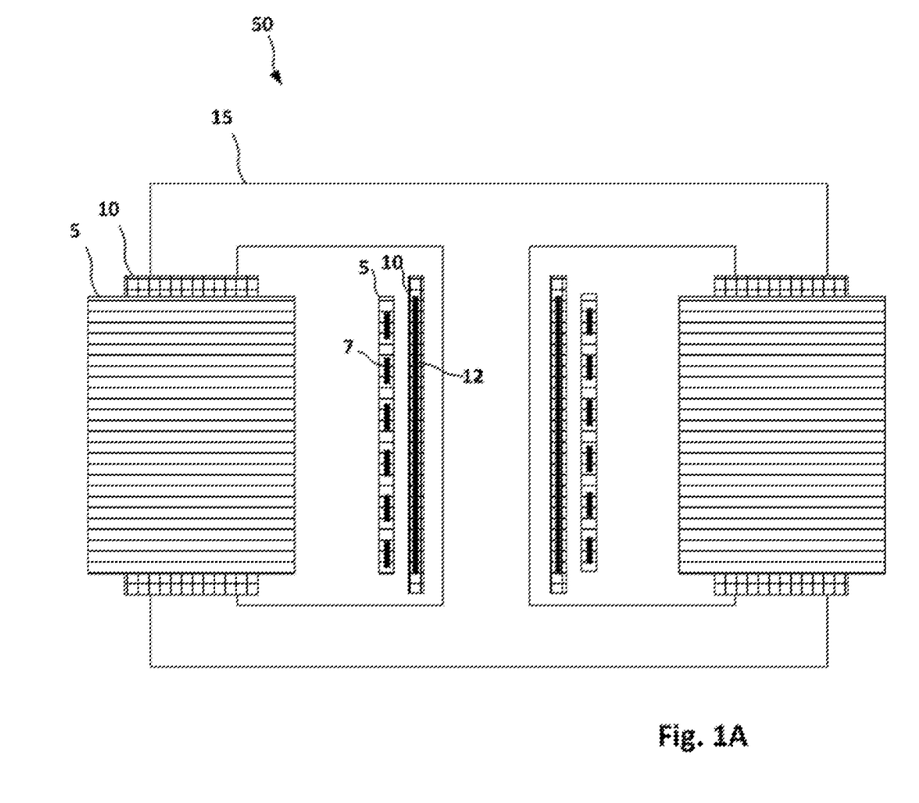
FIG. 1A is a schematic partial view of a non-liquid immersed transformer according to an example.

FIG. 1A is a schematic view of a non-liquid immersed transformer according to an example. Transformer 50 may comprise a high voltage coil 5 and a low voltage coil 10 having a winding wound around a core 15. The high voltage coil 5 may be a disk-foil type coil comprising disks 7. The low voltage coil 10 may be a foil type coil comprising foils 12.

Figure 1B:
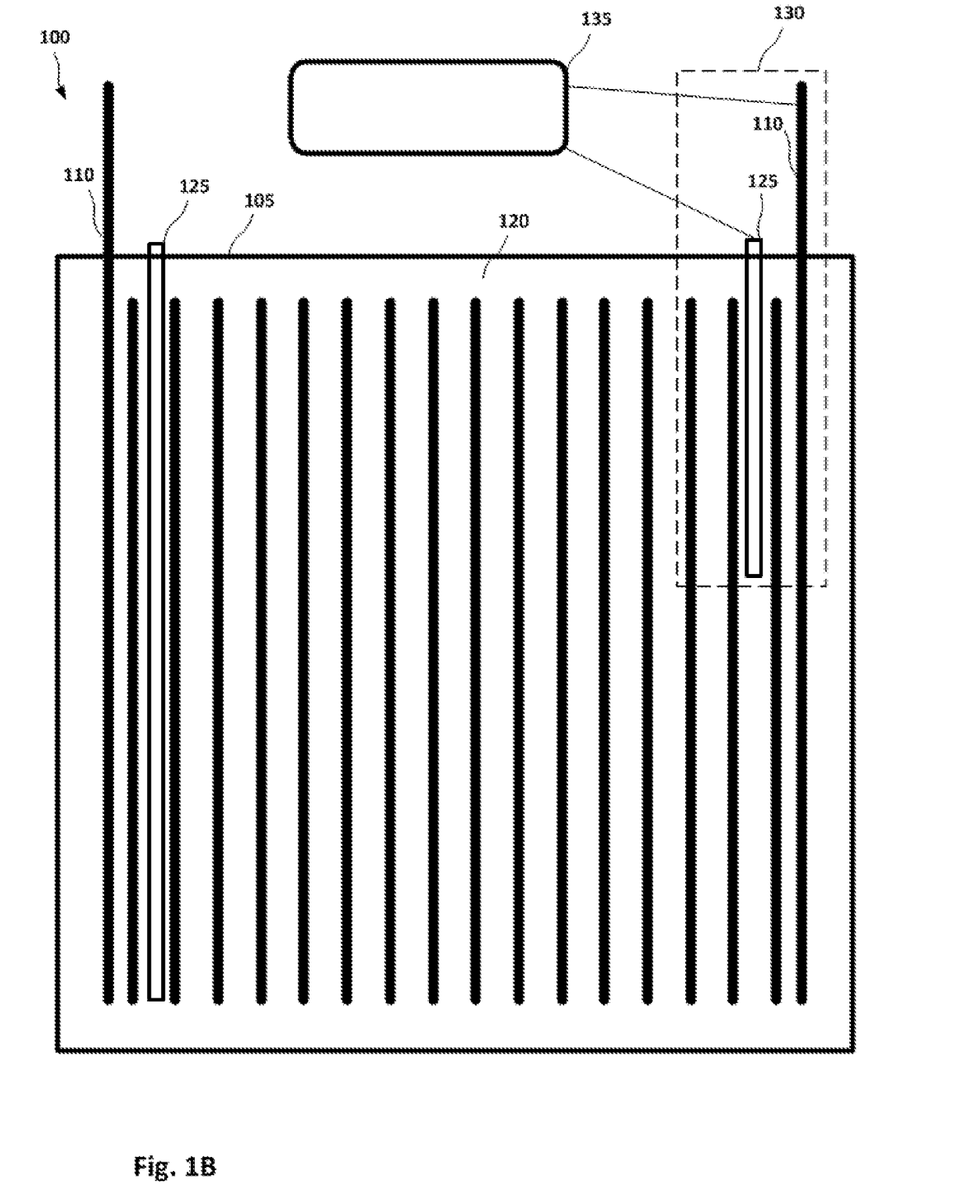
FIG. 1B is a schematic partial view of a coil of a non-liquid immersed transformer of the foil type according to an example.

FIG. 1B is a schematic partial view of a coil 105 of a non-liquid immersed transformer 100, according to an example. The coil 105 may comprise a conductive winding 110. The coil 105 may further comprise a solid insulation 120. One or more floating electrodes 125 may be placed in the solid insulation 120. At least a part of the conductive winding 110 and the one or more floating electrodes 125 may form one or more capacitive elements 130. An electrical parameter of the capacitive element(s) 130 may be measured using a capacitance metering device 135. Such electrical parameter may be complex permittivity. Complex permittivity may be measured along a frequency seep, particularly in the close-to-DC subrange, e.g. 0 Hz-5 Hz. By comparison with the non-aged condition, the aging state of the transformer and the remaining life may be predicted.

Figure 2A:
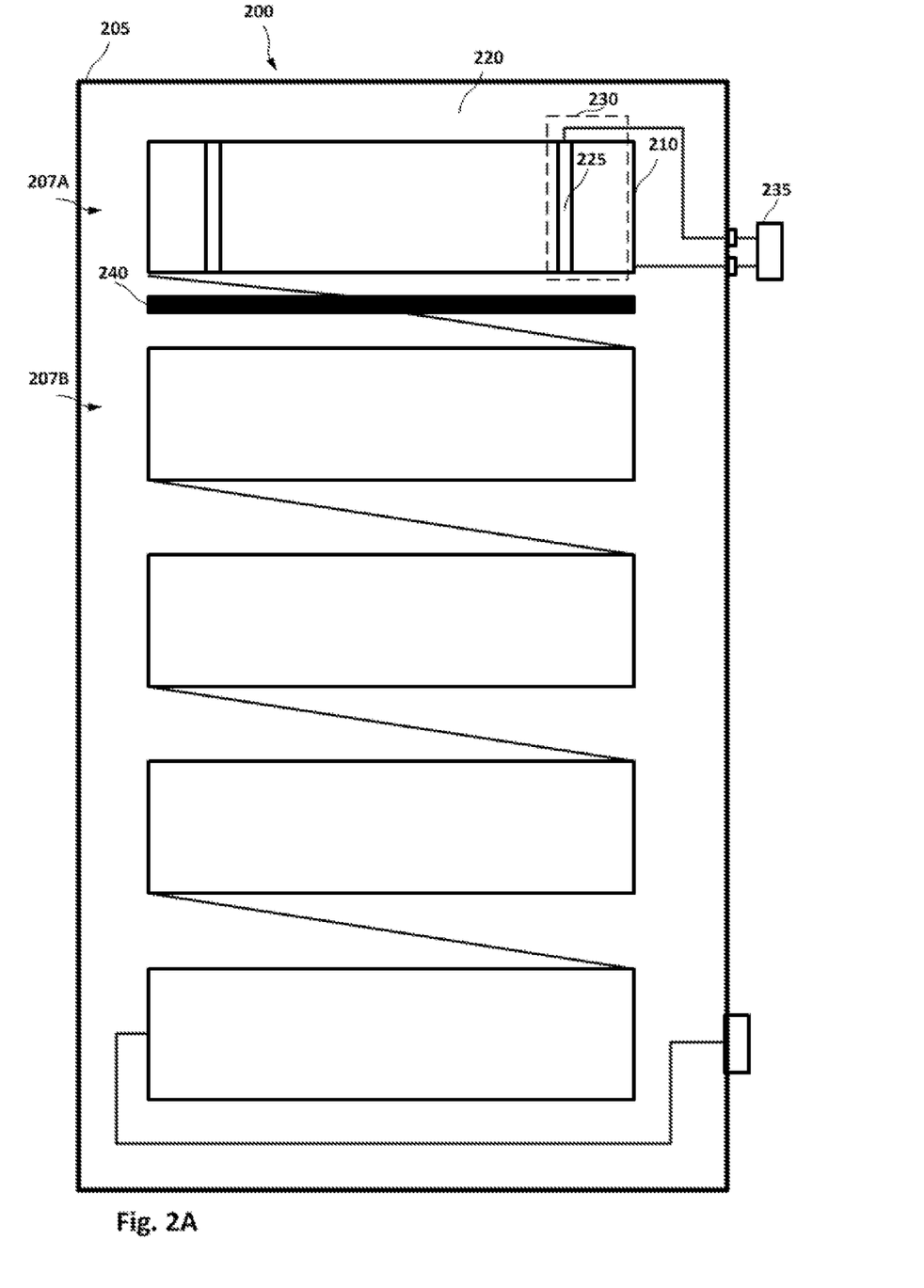
FIG. 2A is a perspective view of a coil of a non-liquid immersed transformer of the foil-disc type according to an example.

FIG. 2A is a perspective view of a coil 205 of a non-liquid immersed transformer 200 of the foil-disc type according to another example. The coil 205 may comprise a conductive winding formed by multiple discs 207. Each disc may comprise multiple turns 210 isolated between each other with interturn insulation. These turns might be of the foil, strap or CTC type. The interturn insulation may be polyester. One or more interturn floating electrodes 225 may be placed in the interturn insulation between turns of disk 207A. The coil 205 may further comprise a solid interdisk insulation 220. The solid interdisk insulation may be epoxy resin.

Furthermore, one or more interdisc floating electrodes 240 may be placed in the solid interdisk insulation between discs 207. At least a part of the disk 207A and the one or more floating electrodes 225, 240 may form one or more capacitive elements 230. An electrical parameter, e.g. complex permittivity, of the capacitive elements may be measured using a capacitance metering device 235. The capacitive elements are formed by the floating electrode and the entire conductive winding of the coil. However, the capacitance contribution of the part of the winding that is closer to the floating electrode (in the example of FIG. 2A it would be the immediate anterior and posterior turns of the disk), is significantly higher (over 90% and even close to 99%) than that of the rest of the winding (which may be less than 10% or even around 1%). That is, it can be safely assumed that the measured electrical parameter (e.g. complex permittivity) corresponds to the insulation material in the space between the floating electrode and the nearest conductive element(s) (e.g. turn(s) of a disk).

Figure 2B:
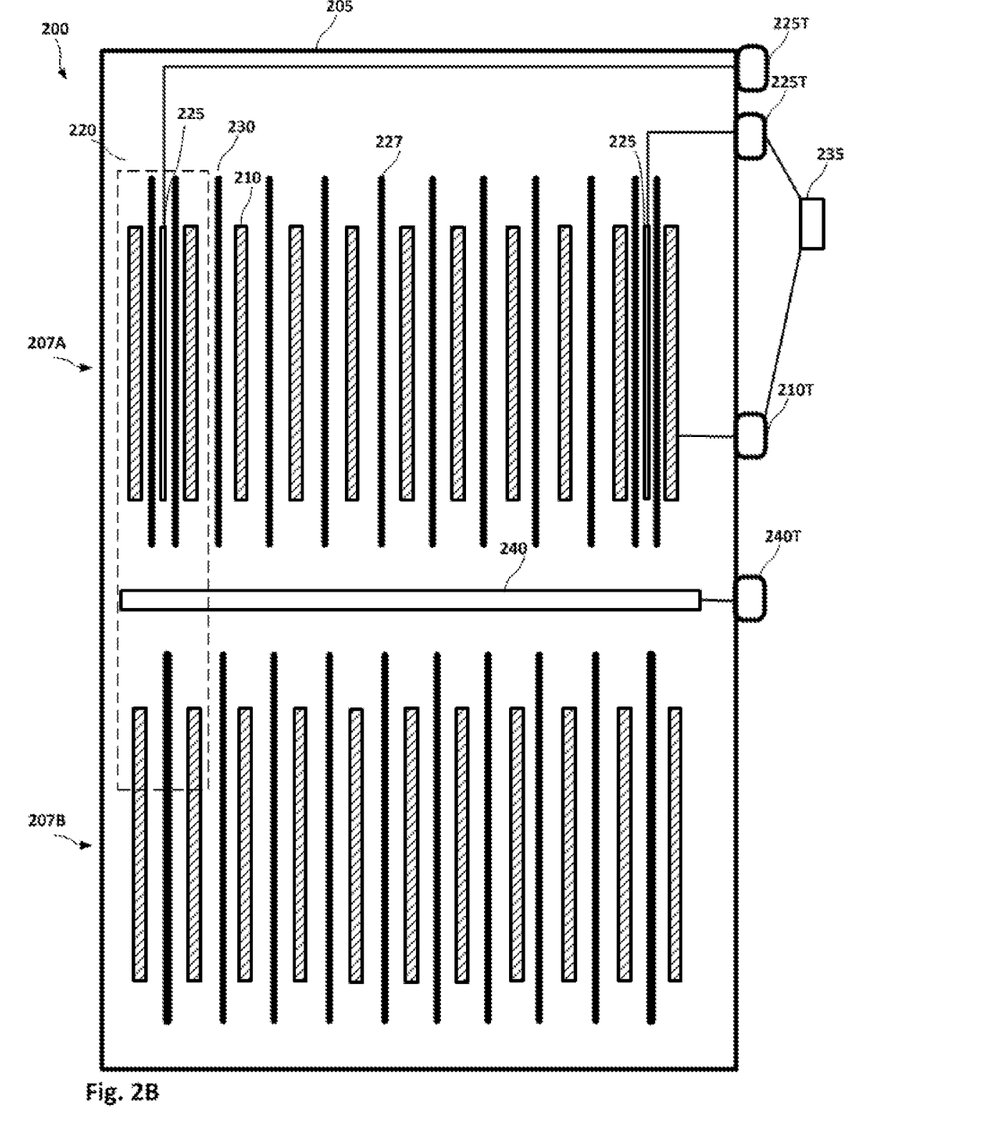
FIG. 2B is a detailed view of a portion of the coil of FIG. 2A.

FIG. 2B is a detailed view of a portion of coil 205 of FIG. 2A. Coil 205 may comprise a conductive winding in the form of disks 207A and 207B. Disk 207A may comprise turns 210 and interturn insulation 227 between the turns 210. A floating electrode 225 may be placed in the solid insulation 220 and may form with a part of the turns 210 a capacitive element 230. A floating electrode 240 may form a capacitive element with the disks 207A and 207B. The capacitance metering device 235 may be coupled between terminal 225T (connected to floating terminal 225) and terminal 210T (connected to winding 210). This will measure interturn insulation aging. Additionally or alternatively, the capacitance metering device 235 may be coupled between terminal 240T (connected to floating terminal 240) and terminal 210T (connected to winding 210). This will measure interdisk insulation aging.

Figure 2C:
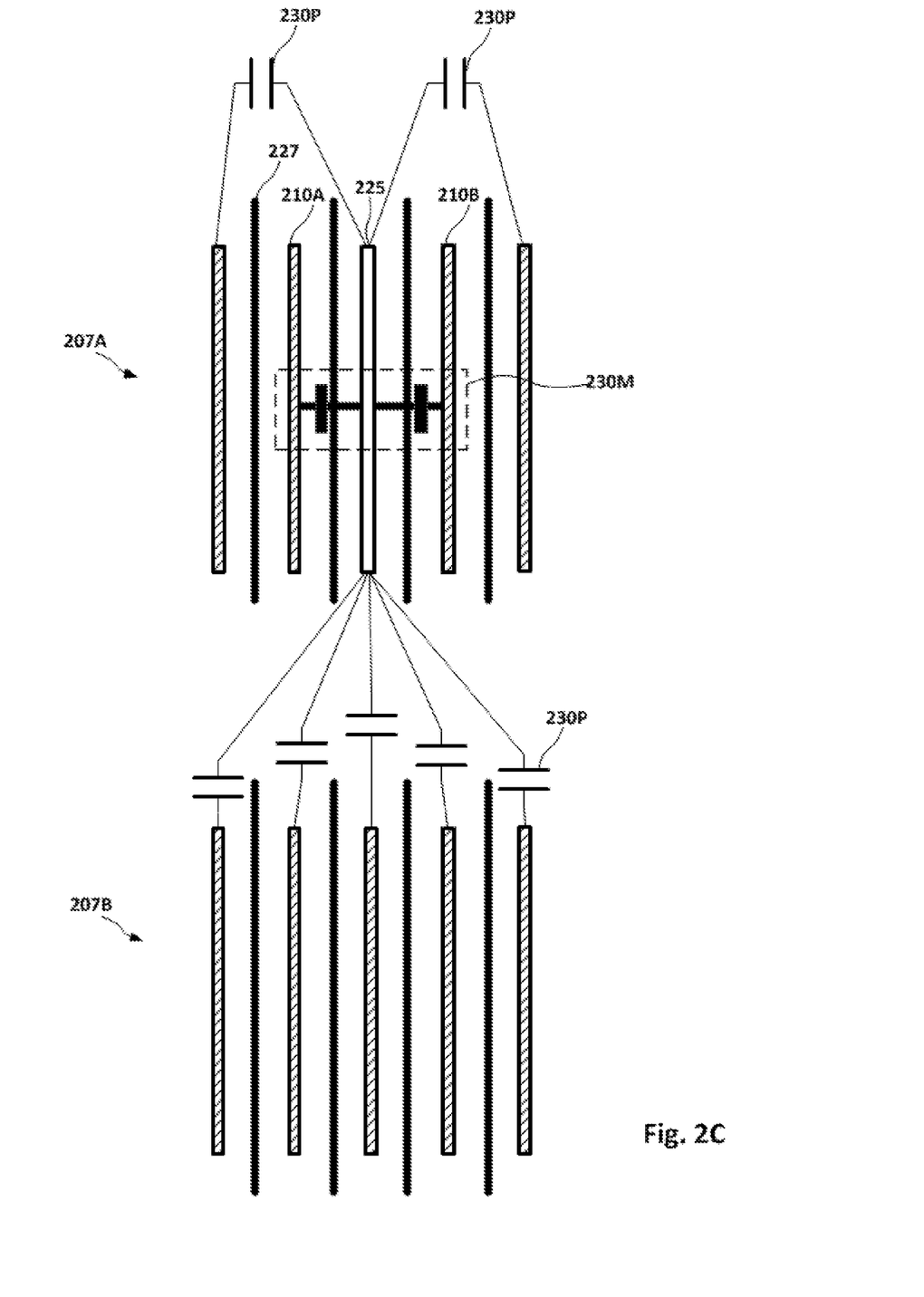
FIG. 2C schematically illustrates an analysis of a capacitive element formed by a floating electrode in a foil-disc coil.

FIG. 2C schematically illustrates an analysis of the capacitive element formed by the floating electrode 225. A main capacitor 230M is formed between the floating electrode 225 and the nearest turns 210A, 210B. Additional capacitors ("parasitic" capacitors) may be formed between the floating electrode 225 and other conductive portions (turns) of disk 207A or even with conductive portions (turns) of disk 207B. The complex permittivity of the overall capacitor (sum of all capacitive elements shown in FIG. 2C) may be measured between the floating electrode and the winding. However, as the dominant capacitor is the main capacitor 230M, each measurement may be an indication of degradation of the interturn insulation, e.g polyester, in the space between the turns 210A and 210B.

Floating electrodes may be interturn (e.g. in all types of windings), interdisk (in disk windings) or interlayer (in layer windings). In case of interturn floating electrodes the main capacitor of the capacitive element, i.e. at least 90% of the capacitance of the capacitive element, is formed by the previous (anterior) and next (posterior) turns of the conductive winding (e.g. foil, CTC, etc.). In case of interdisk floating electrodes the main capacitor of the capacitive element is formed by the previous and next disks of the coil. In case of interlayer floating electrodes the main capacitor of the capacitive element is formed by the previous and next layers of the coil.

Figure 3:
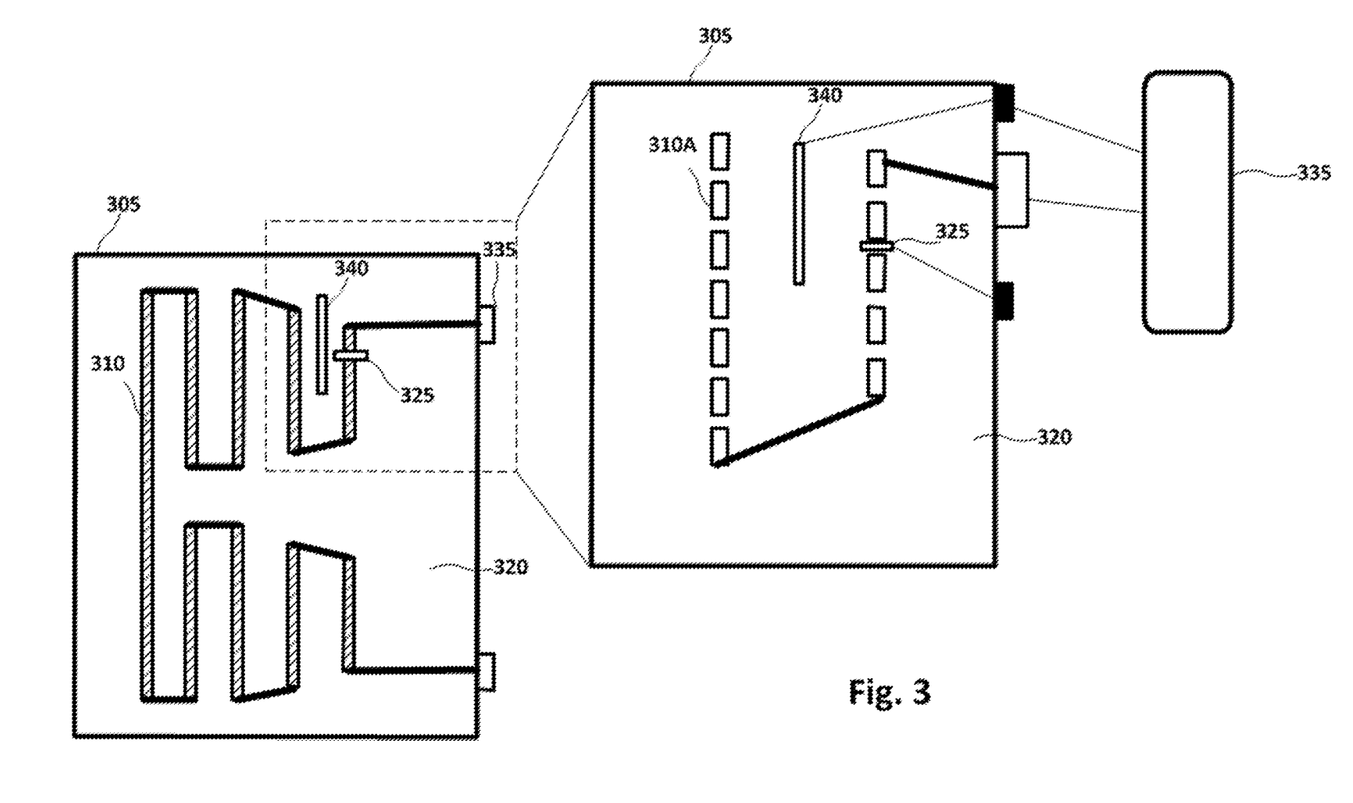
FIG. 3 is a perspective view of a coil of a non-liquid immersed transformer of the layer-strap or of the layer-CTC type according to an example.

FIG. 3 is a perspective view of a coil 305 of a non-liquid immersed transformer of the layer-strap or of the layer-CTC type according to an example. The coil 305 may comprise a conductive winding formed by multiple layers 310. Each layer 310 may comprise multiple turns 310A. These turns might be of the types strap or CTC insulated using solid dielectrics between them The coil 305 may further comprise a solid insulation 320. The solid insulation may be fiberglass impregnated with epoxy resin. One or more floating electrodes 325 may be placed in between the solid insulation between turns 310A. Furthermore, one or more interlayer floating electrodes 340 may be placed in the solid insulation between layers. At least a part of the layer winding 310 and the one or more floating electrodes 325, 340 may form one or more capacitive elements. The capacitive elements may be measured using a capacitance metering device 335.

Figure 4:
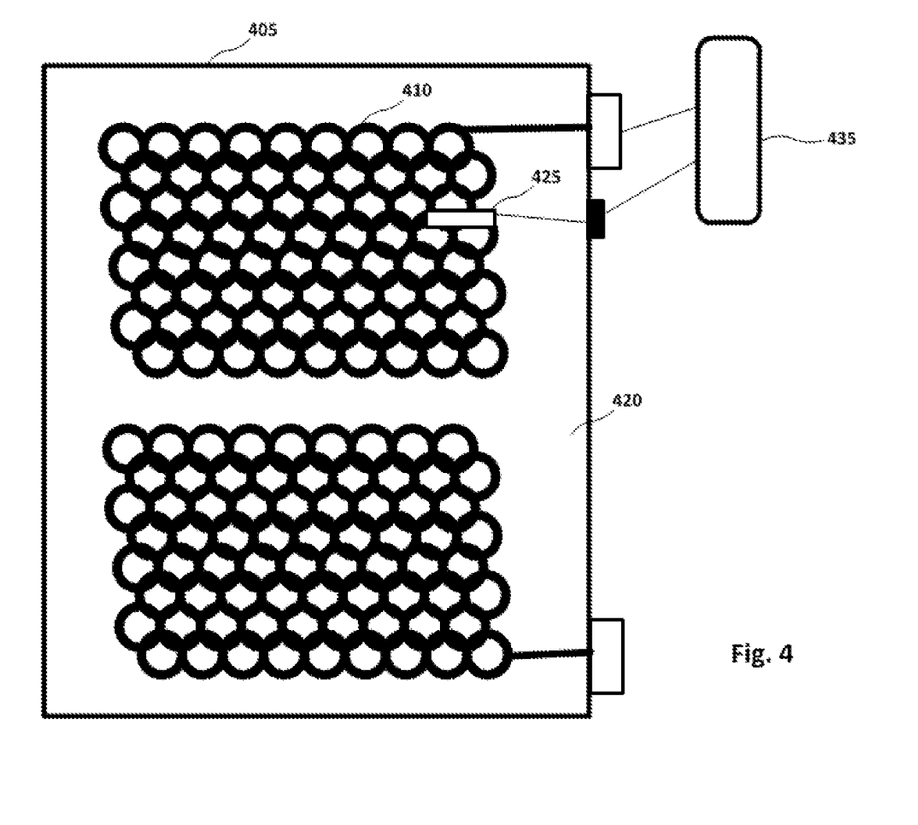
FIG. 4 is a perspective view of a coil of a non-liquid immersed transformer of the random-wire type according to an example.

FIG. 4 is a perspective view of a coil 405 of a non-liquid immersed transformer of the random-wire type according to an example. The coil 405 may comprise multiple conductors 410 isolated between each other with solid insulating material (e.g. polyester or enamel). Each conductor may be a circular cable. The coil 305 may further comprise a solid insulation 420. Between cables there may further be polyester insulation. The solid insulation may be epoxy resin. One or more floating electrodes 425 may be placed in the solid insulation 420 between conductors 410. At least a part of the winding 410 and the one or more floating electrodes 425 may form one or more capacitive elements. The capacitive elements may be measured using a capacitance metering device 435.

Figure 5:
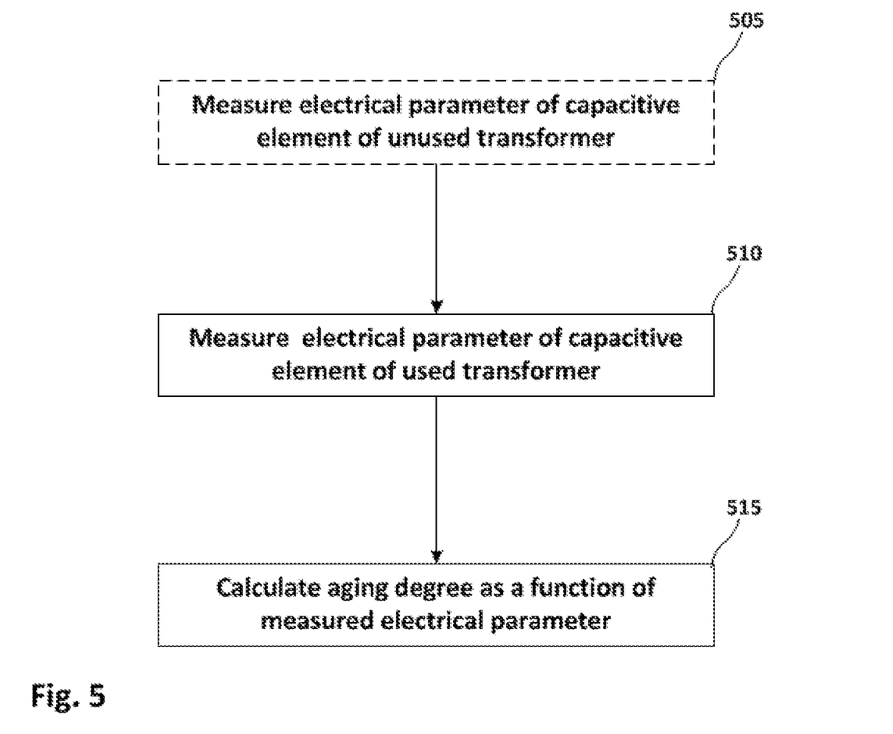
FIG. 5 is a flow diagram of a method of assessing aging of at least a portion of a solid insulation of a dry type transformer according to an example.

FIG. 5 is a flow diagram of a method of assessing aging of at least a portion of a solid insulation of a dry type transformer according to an example. In block 505, a first electrical parameter, e.g. complex permittivity, of the capacitive element at a first point in time (e.g. before or during first use of the transformer) may be measured. In block 510, a second electrical parameter, e.g. complex permittivity of the capacitive element at a second point in time (periodically or after a number of uses or after a period of time) may be measured. In block 515, the aging degree of the insulation and/or the transformer may be calculated as a function of the first and second complex permittivity measurements. A computing device may comprise a memory to store electrical parameter values (e.g. complex permittivity values) associated with aging degrees of one or more types of insulation material. After electrical parameter values are measured, using one or more floating electrodes as disclosed herein, the computing device may compare the measured values with stored values for the same or similar insulation material and may provide an indication of the aging degree of the insulation material.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

The invention claimed is:

1. A non-liquid immersed transformer comprising:
a core;
a coil having a conductive winding around the core;
a solid insulation inside the coil;
one or more floating electrodes in the solid insulation, wherein at least a part of the conductive winding and the one or more floating electrodes form one or more capacitive elements, respectively, and the transformer comprises a capacitance metering device connected between a terminal connected to the one or more floating electrodes and a terminal connected to the part of the conductive winding, and wherein the non-liquid immersed transformer comprises a dry-type transformer.

2. The non-liquid immersed transformer according to claim 1, comprising a plurality of floating electrodes distributed in the solid insulation, each floating electrode to form a capacitive element with a different part of the conductive winding.

3. The non-liquid immersed transformer according to claim 1, wherein the conductive winding comprises foil turns, whereby the floating electrode is placed in the solid insulation between foil turns, whereby the capacitive element is formed between the floating electrode and the foils of the winding.

4. The non-liquid immersed transformer according to claim 1, wherein the conductive winding comprises a disk coil formed by foil, straps or continuously transposed conductors.

5. The non-liquid immersed transformer according to claim 4, wherein the floating electrode is placed between the solid insulation between turns of a disk of the disk coil, whereby the capacitive element is formed between the floating electrode and the turns of the conductive winding.

6. The non-liquid immersed transformer according to claim 4, wherein the floating electrode is a floating ring placed between disks of the disk coil, whereby the capacitive element is formed between the floating ring and the disks of the conductive winding.

7. The non-liquid immersed transformer according to claim 1, wherein the conductive winding comprises a layer-strap or a layer-CTC coil comprising layers, each layer having turns, whereby one or more capacitive elements is formed between the floating electrode and the layers and/or between the turns of the layers of the conductive winding;

or the conductive winding comprises a random-wire or wire drop coil comprising circular cables, whereby the capacitive element is formed between the floating electrode and the circular cables of the conductive winding.

8. The non-liquid immersed transformer according to claim 1, wherein the floating electrode is placed along a portion of the solid insulation.

9. The non-liquid immersed transformer according to claim 1, comprising a dry-type transformer.

10. The non-liquid immersed transformer according to claim 1, wherein the solid insulation comprises one of a polyester film, an epoxy resin, enamel or a meta-aramid material.

11. A method of assessing aging degree of at least a portion of a solid insulation of a dry type transformer comprising capacitive elements that include the one or more floating electrodes according to claim 1, the method comprising measuring an electrical parameter of the capacitive element across the one or more floating electrodes and a conductive winding of the dry type transformer and calculating the aging degree as a function of the electrical parameter measurement, wherein the electrical parameter measured is complex permittivity.

12. The method according to claim 11, further comprising:

measuring a first complex permittivity of the capacitive element at a first point in time;

measuring a second complex permittivity of the capacitive element at a second point in time;

calculating the aging degree as a function of the first and second complex permittivity measurement.

13. The method according to claim 11, wherein measuring an electrical parameter comprises measuring complex permittivity in a broad frequency range.

14. The method according to claim 11, wherein measuring an electrical parameter comprises measuring complex permittivity in a low frequency range of between 0 Hz and 5 Hz.

15. The non-liquid immersed transformer according to claim 1, wherein the one or more floating electrodes in the solid insulation is not in contact with conductive elements of the coil.

16. The non-liquid immersed transformer according to claim 1, wherein no portion of one of the one or more floating electrodes is in contact with conductive elements of the coil.

17. The non-liquid immersed transformer according to claim 1, wherein one of the one or more floating electrodes is in contact with the solid insulation on all sides.

* * * * *